United States Patent [19]
Frisch et al.

[11] Patent Number: 5,428,626
[45] Date of Patent: Jun. 27, 1995

[54] TIMING ANALYZER FOR EMBEDDED TESTING

[75] Inventors: Arnold M. Frisch, Portland; Thomas A. Almy, Tualatin, both of Oreg.

[73] Assignee: Tektronix, Inc., Wilsonville, Oreg.

[21] Appl. No.: 138,856

[22] Filed: Oct. 18, 1993

[51] Int. Cl.$^6$ .................. G01R 31/28; G06F 11/00
[52] U.S. Cl. .................. 371/27; 371/23; 371/22.1; 371/22.3; 324/73.1; 324/158.1; 364/578; 364/488; 364/489
[58] Field of Search .......... 371/23, 27, 22.1, 22.3; 324/158 R, 73.1; 307/451, 603; 331/57; 364/578, 489, 488

[56] References Cited

U.S. PATENT DOCUMENTS

| | | | |
|---|---|---|---|
| 4,578,600 | 3/1986 | Magee | 307/451 |
| 4,744,084 | 5/1988 | Beck et al. | 371/23 |
| 4,807,147 | 2/1989 | Halbert et al. | 364/487 |
| 4,833,350 | 5/1989 | Frisch | 307/475 |
| 4,876,519 | 10/1989 | Davis et al. | 331/57 |
| 4,998,071 | 3/1991 | Strid et al. | 324/612 |
| 5,013,944 | 5/1991 | Fischer et al. | 307/603 |
| 5,091,872 | 2/1992 | Agrawal | 364/578 |
| 5,111,136 | 5/1992 | Kawashima | 324/158 R |
| 5,150,044 | 9/1992 | Hashizume et al. | 324/158 R |
| 5,231,314 | 7/1993 | Andrews | 324/158 R |
| 5,239,274 | 8/1993 | Chi | 331/57 |
| 5,239,455 | 8/1993 | Fobbester | 363/60 |
| 5,248,937 | 9/1993 | Hölzle | 324/158 R |
| 5,254,942 | 10/1993 | D'Souza et al. | 324/158 R |
| 5,282,146 | 1/1994 | Aihara et al. | 364/489 |
| 5,285,152 | 2/1994 | Hunter | 324/158 R |

OTHER PUBLICATIONS

Proceedings Letters of IEEE, Apr. 1971 entitled "A Digital Phase and Frequency-Sensitive Detector" by J. I. Brown.
IEEE Transactions on Communications, vol. COM-28 No. 11, Nov. 1980 entitled "Charge-Pump Phase-Lock Loops" by Floyd M. Gardner.
"IEEE Standard Test Access Port & Boundary-Scan Architecture" published by the Institute of Electrical and Electronics Engineers, Inc., May 21, 1990.
"JTAG Boundary-Scan Test—Adding testability also aids debugging" by Richard A. Quinnell from Technology Update, EDN Aug. 2, 1990.
"Bt612—200 MHz ATE Channel Controller" from On The Fly, Brooktree Corporation's Newsletter for the ATE Designer, Spring 1992.
"A PLL Clock Generator with 5 to 110 MHz of Lock Range for Microprocessor" by Ian A. Young, Jeffrey K. Greason & Keng L. Wong from IEEE Journal of Solid-State Circuits, vol. 27 No. 11, Nov. 1992.
"SCAN 18245T Serially Controlled Access Network Non-Inverting Transceiver with TRI-STATE Outputs" from National Semiconductor 18245T.
"20-Bit Transceiver (3-State, Non-Inverting)" from Motorola Semiconductor Technical Data, 1993 Rev 2.

*Primary Examiner*—Ellis B. Ramirez
*Assistant Examiner*—Alan Tran
*Attorney, Agent, or Firm*—Francis I. Gray

[57] ABSTRACT

A timing analyzer for embedded testing of printed circuit boards, integrated circuits or multi-chip modules is in the form of an integrated circuit that may be included as part of the printed circuit board, integrated circuit or multi-chip module being tested. Each channel of a data path to be tested has a timing analyzer circuit that may be coupled into the path when enabled for testing. The timing analyzer circuit has instruction memories that are loaded with time event commands via a suitable program bus, such as a boundary scan interface. Each event command has a clock portion, an interpolation portion and a drive output portion. A counter counts down the clock portion using a system clock from the board/circuit/module to produce a terminate pulse. The terminate pulse is delayed by an increment less than one period of the system clock by a delay interpolator, the amount of delay being determined by the interpolation portion, to generate a trigger signal. The trigger signal clocks a capture register to acquire the logic level at a selected one of the pins, and optionally causes a selected output to be driven according to the drive output portion. A shared delay calibration circuit uses a charge-pumped phase locked loop to generate a precision supply voltage for the delay elements in the delay interpolator, the delay for each delay element being a function of the applied supply voltage.

21 Claims, 12 Drawing Sheets

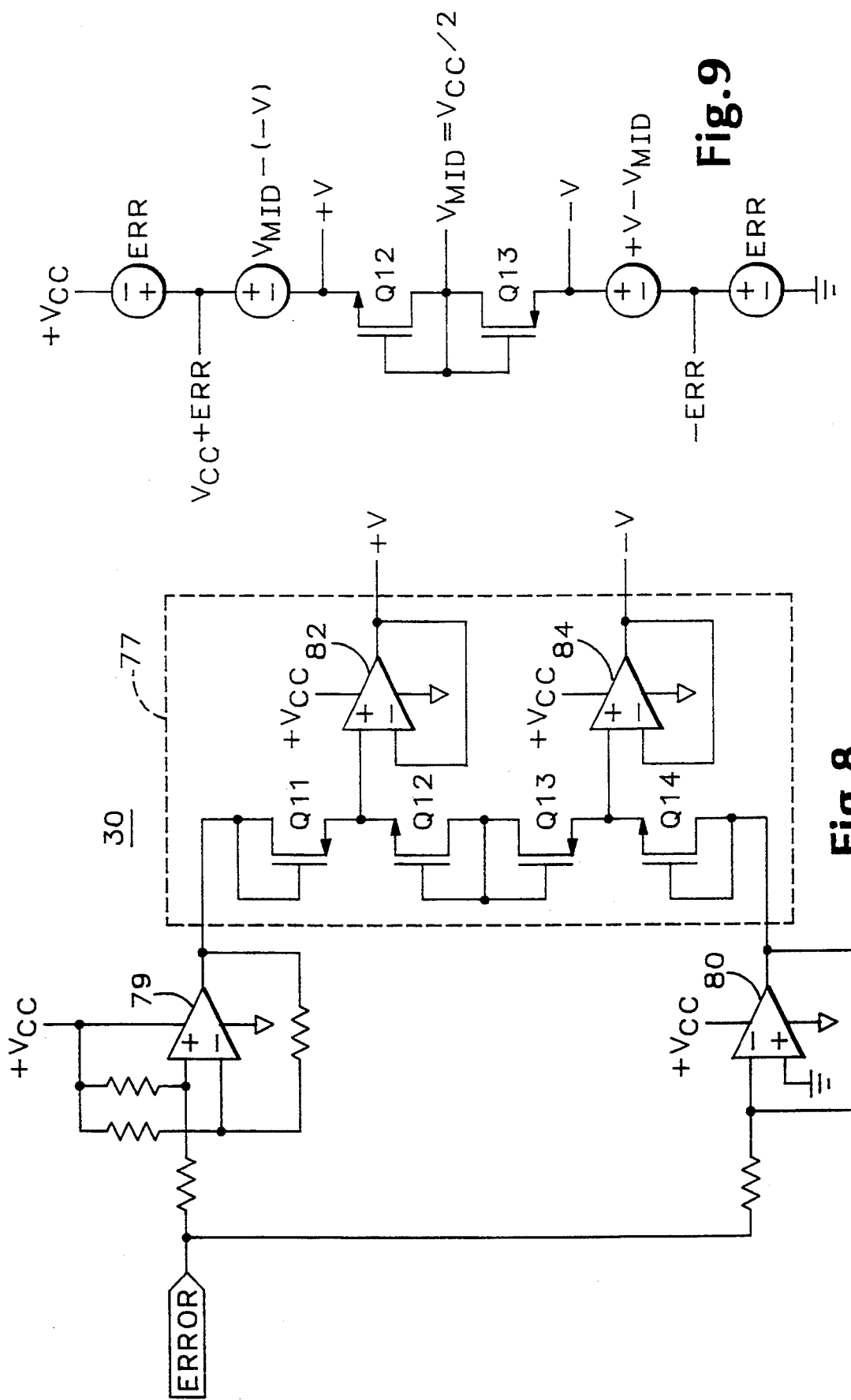

TIMING ANALYZER FOR EMBEDDED TESTING

BACKGROUND OF THE INVENTION

The present invention relates to test and measurement of printed circuit boards, integrated circuits or multi-chip modules, and more particularly to a timing analyzer for embedded testing of such printed circuit boards, integrated circuits or multi-chip modules where the timing analyzer may be included in the end product.

As integrated circuits continue to increase in complexity and package density, designing for testability becomes necessary. One method of design for testability is a boundary scan test technique that has been developed by the Joint Test Action Group (JTAG) and is standardized in IEEE Standard 1149.1, which is incorporated herein by reference. The boundary scan test technique provides for embedded testing of integrated circuits and printed circuit boards. This technique was developed due to the difficulty of testing surface mount printed circuit boards. The high component density and fine lead sizes of surface mount components make testing using traditional bed-of-nails probes difficult at best. When the components are mounted on both sides of the board, or when circuit traces lie wholly on internal board layers, probing methods become inadequate. The boundary scan technique requires a four-wire serial test bus with four signals: Test Data In (TDI); Test Data Out (TDO); Test Mode Select (TMS); and Test Clock (TCK). TDI and TMS assume a logic high state if not actively driven, ensuring that the test circuitry always receives a known value on these lines. TDO is a three-state signal that is active when data is being shifted through an integrated circuit (IC) in which the hardware for this technique is embedded. At all other times it is a high impedance signal.

This technique allows the state of all digital I/O pins on a component to be examined or changed, hence the name "boundary scan." By wiring together the TMS and TCK on all ICs and connecting TDO of one IC to TDI of the next, the entire board is tested with a single bus. The details of this technique are described in the above-identified IEEE Standard 1149.1 and in an article in the Aug. 2, 1990 issue of EDN entitled "Adding Testability Also Aids Debugging" by Richard A. Quinnell, incorporated herein by reference. The circuitry defined by the boundary scan standard allows test instructions and associated test data to be fed into a component and, subsequently, allows the test results of execution of such instructions to be read out. All information, instructions, test data and test results, are communicated in a serial format.

Using this boundary scan technique allows virtual probing of state at the IC leads and provides an indication of whether the printed circuit board, integrated circuit or multi-chip module is properly connected. However the boundary scan technique does not identify where or what the problem may be when the printed circuit board, integrated circuit or multi-chip module is not functioning when the problem is related to speed or timing. Particularly where the malfunctioning is a result of timing errors within the printed circuit board or multi-chip module, there is no way to properly test the circuitry. Brooktree Corporation of San Diego, Calif., United States of America has developed a 200 MHz ATE Channel Controller—the Bt612. The primary function of the Bt612 is for providing high-performance, on-the-fly per-pin timing and format, but it is also useful for central phase clock generation, both static and dynamic. The Bt612 is a low density, bipolar circuit with no program store, is expensive and uses excessive power. Further the vernier delay is an analog d.c. voltage that is proportional to the distance between clock pulses which is derived from a ramp signal.

What is needed is an inexpensive, highly integrated, multi-channel timing analyzer for embedded testing that tests timing signals for a printed circuit board, integrated circuit or multi-chip module.

SUMMARY OF THE INVENTION

Accordingly the present invention provides a timing analyzer for embedded testing that provides precise, digitally generated timing signals. The timing analyzer may be part of an integrated circuit or may be an independent integrated circuit. Each channel of the integrated circuit has an independent timing analyzer circuit for acquiring data and optionally driving data when the timing analyzer circuit is enabled. Timing event commands, in the form of test data, are loaded into instruction memories for each timing analyzer circuit via a program bus. The timing event commands include a clock portion, an interpolation portion and a command portion. When executed, the clock portion is loaded into a down counter and the interpolation portion is loaded via a command register into an interpolator. At the conclusion of the down counter's count, using an external or system clock from the circuit being tested, a pulse is output to the interpolator. At the conclusion of the interpolator interval, which is a time increment less than one external or system clock period, a capture register is triggered to capture data. The trigger from the interpolator interval also is input to drive logic to drive data for the channel when enabled by the command portion in the command register. The captured data for all channels is read out as test results over the program bus.

The timing analyzer includes a shared delay calibration circuit that calibrates each delay element in the interpolators for every channel to be a specific submultiple of the external clock obtained from the printed circuit board, integrated circuit or multi-chip module being tested, and of which the timing analyzer integrated circuit may be a part. The shared delay calibration circuit is a voltage controlled ring oscillator and multiplexer, with the delay elements in the oscillator being the same as those in the interpolators. A voltage generator converts an error voltage from a phase locked loop, which compares the oscillator output with the external clock, into a calibrated control voltage for the interpolator and ring oscillator delay elements. The voltage generator provides a maximum possible range of values compatible with the power supply voltages, which in turn provides a wide range of external clock frequencies over which the timing analyzer operates.

The objects, advantages and novel features of the present invention are apparent from the following detailed description when read in light of the appended claims and attached drawing.

BRIEF DESCRIPTION OF THE DRAWING

FIG. 8 is a schematic diagram of a variable supply voltage generator for the shared delay calibration circuit according to the present invention, FIG. 9 is an illustrative diagram of an alternative variable supply voltage generator for the shared delay calibration circuit according to the present invention.

DESCRIPTION OF THE PREFERRED EMBODIMENT

Figure 1:
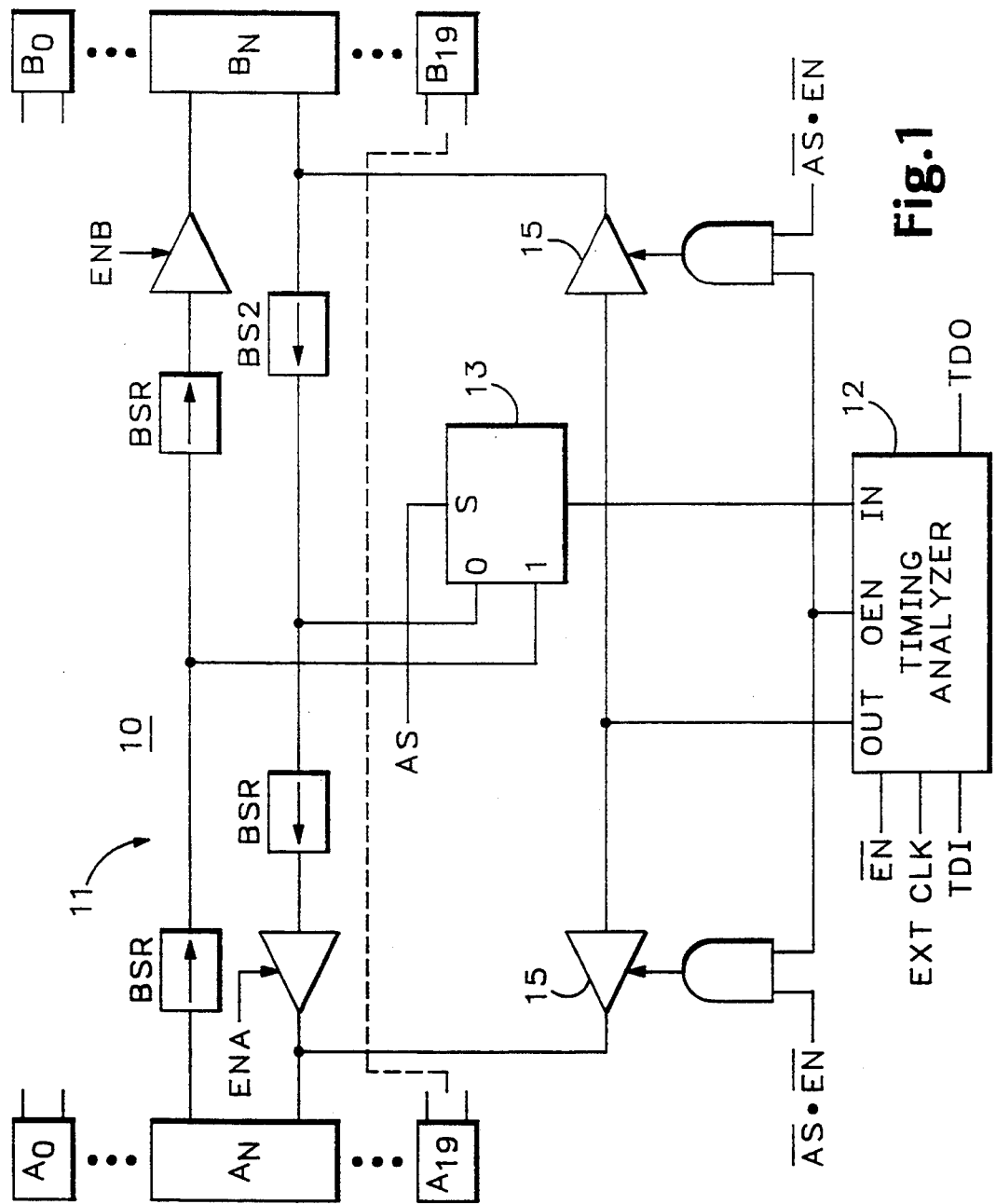
FIG. 1 is a partial block diagram of an integrated circuit with a timing analyzer according to the present invention.
Figure 2:
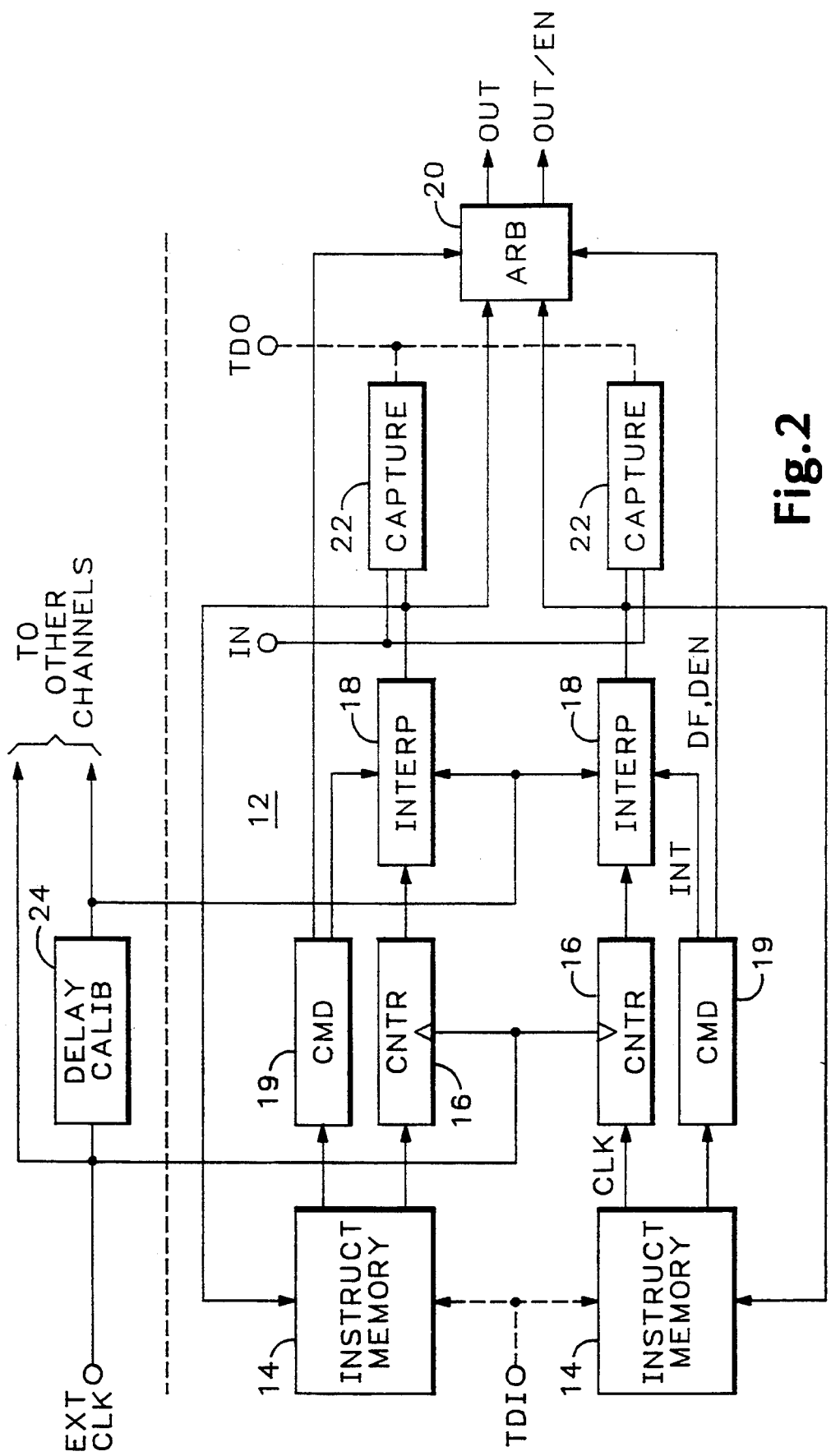
FIG. 2 is a block diagram for one channel of a timing analyzer circuit according to the present invention.

Referring now to FIGS. 1 and 2 a multiple channel integrated circuit 10, including a timing analyzer circuit 12 for each channel, provides for embedded testing applications of printed circuit boards, integrated circuits or multi-chip modules. Each timing analyzer circuit 12 executes independent timing events in each of the channels at high frequency rates, such as 100 MHz, with great precision, such as 312.5 picoseconds. The timing analyzer circuit 12 automatically adjusts for clock rates from the printed circuit board, integrated circuit or multi-chip module, in which the timing analyzer may be included, over a wide range of frequencies, such as 10-100 MHz, and for temperature/process variations, and may be calibrated to compensate for inter-channel skew.

The integrated circuit 10 shown in FIG. 1 is in the form of a three-state transceiver 11, with a boundary scan interface according to IEEE Standard 1149.1 that is compatible with the National Semiconductor SCAN18245T and Motorola MC20LXT245 in general pinout and normal application, with a timing analyzer circuit 12 added for each channel. Added to the pinout are an external clock reference (EXT CLK) and a real-time enable (nEN) for the timing analyzer circuits 12. The timing analyzer circuits 12 provide the ability to capture signal timing information and to drive data pins to tight timing tolerances for high speed in-circuit testing of assemblies, as indicated above. The signals being transferred on one channel between a pair of the IC pins are input to a multiplexer 13. The output of the multiplexer 13 is determined by a pin select signal AS that determines the direction of the data flow. The pin select signal is loaded into a test data register as part of the boundary scan loading process. The timing analyzer circuit 12 receives the external clock reference from the printed circuit board, integrated circuit or multi-chip module, i.e., the device under test (DUT), of which the integrated circuit 10 may be a part. The timing analyzer circuit 12 drives test data into the DUT via the appropriate output pin of the IC 10 as determined by select gates 15 that are enabled by the pin select signal and the timing analyzer enable signal, all according to an event command loaded into an instruction memory 14. Each timing analyzer circuit 12 has two instruction memories 14 and two sets of timing logic. Event commands are interleaved when the instruction memories 14, which are part of the test data register of the boundary scan interface, are loaded to allow one capture or drive operation per external clock cycle. The timing analyzer circuit 12 also captures test data from the DUT via the multiplexer 13 from the input pins in response to such event commands.

Each event command in the instruction memory 14 has a clock portion (CLK), an interpolator portion (INT), a data output bit (DO) and a driver output enable bit (OEN). The clock portion of each event instruction is loaded from the appropriate instruction memory 14 into a down counter 16, and the interpolator portion is decoded and provided to a timing interpolator 18 via a command register 19. The down counter 16 may be in the form of a state machine for determining between which clock pulses of the external clock reference interpolation is to occur in response to the clock portion of each event instruction. The down counter 16, or state machine, provides a pulse output after N counts of the external clock reference, where N is the count loaded into the counter. The timing interpolator 18 delays the pulse output from the down counter 16 and provides a trigger output at M/X of a period of the external clock later, where M is the interpolator portion of the event command and X is the number of delay elements in the timing interpolator 18. If the number of delay elements X is thirty-two (32), then the timing interpolator 18 provides timing with a resolution of 1/32 of the external clock period. An arbitration circuit 20 receives the trigger output from the timing interpolator 18, and provides a test signal (OUT) determined by the data output bit to the IC output pin when enabled by the driver output enable bit from the command register 19. A capture register 22, which is also part of the test data register for the boundary scan interface, captures test data (IN) from the DUT. A shared delay calibration circuit 24 also receives the external clock to generate a calibration signal in the form of supply voltages for the delay elements of the timing interpolators 18 in each of the timing analyzer circuits 12 for all channels so that the delay through each delay element is 1/X of the external clock period. The data in the capture register 22 is read out via the boundary scan interface. At the conclusion of one event command the trigger from the interpolator 18 causes the appropriate instruction memory 14 to transfer the next event command to its down counter 16 and command register 19 for execution.

In operation the event commands are executed by alternating between the two queues. When an event command is loaded into its down counter 16, the counter counts down to its terminal value before the command's action takes place. At the terminal value additional delay is added from the interpolator 18 in units, for this example, of 1/32 external clock period. After the delay the logic level on the input pin is captured in the capture register 22. If the drive output enable bit is high, the output pin is driven by the value of the driver output bit. By this interleaving technique one event command may be executed per external clock cycle. If only data capture is being performed, two acquisitions may occur within one external clock cycle or within one interpolator count between adjacent external clock cycles. Driving commands require a separation of at least one external clock period. Although a boundary scan technique is described for the timing analyzer of the present invention, any suitable program bus may be used to load the instruction memories 14 and read out the capture registers 22.

Figure 3:
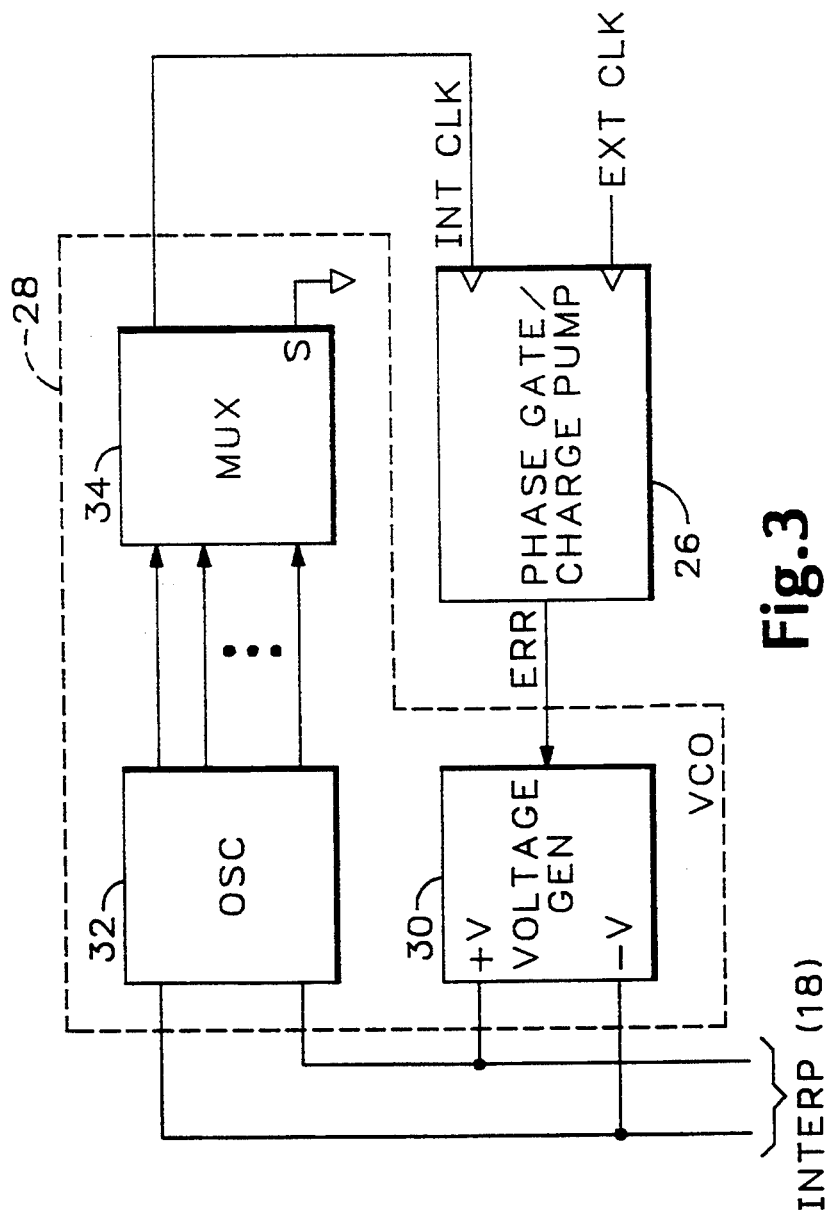
FIG. 3 is a block diagram of a shared delay calibration circuit for the timing analyzer circuits according to the present invention.

As shown in FIG. 3 the shared delay calibration circuit 24 is in the form of a charge-pumped phase-locked loop (PLL), such as is described in IEEE Transactions on Communications, Vol. COM-28, No. 11, November 1980 at pages 1849-1858, "Charge-Pump Phase-Lock Loops" by Floyd M. Gardner, incorporated herein by reference. The function of the shared delay calibration circuit 24 is to calibrate the delays of delay elements used in the interpolators 18. The PLL includes a phase/frequency detector (PFD) 26, as shown in greater detail in FIG. 4 and such as is described in the April 1971 Proceedings of the IEEE at pages 717-718 in a Proceedings Letter by J. J. Brown entitled "A Digital Phase and Frequency-Sensitive Detector", incorporated herein by reference. The PFD 26 has as inputs the external clock reference from the DUT and an internal clock signal (INT CLK) from a voltage controlled oscillator (VCO) 28, and provides an error signal (ERR) output. ERR is input to a reference voltage generator 30 within the VCO 28 to provide a pair of variable voltage rails $+V$, $-V$ as outputs. $+V$ and $-V$ are applied to the delay elements of a ring oscillator (OSC) 32 to control its frequency. In the present embodiment the ring oscillator 32 has fifteen inverters and one transmission gate arranged to have the same propagation delay as an inverter. The OSC 32 has a plurality of differential phase outputs that are input to a multiplexer (MUX) 34, the selected one of the plurality of differential phase outputs being the internal clock for the PFD 26 which completes the PLL. The multiplexer 34 serves to load the ring oscillator stages. The PLL locks the ring oscillator to the external clock, derived from the device under test, i.e, printed circuit board, integrated circuit or multi-chip module, by adjusting the power supply voltage applied to the inverters and transfer switch in a way that keeps the switching threshold constant. This changes the propagation delays of the delay elements and the resulting ring oscillator frequency, as will be described in more detail below. When the PLL is locked, the delay element delays for this example are calibrated at 1/32 of the external clock cycle so that any delay elements powered by the same power supply and loaded in a like manner exhibit that same delay.

Figure 4:
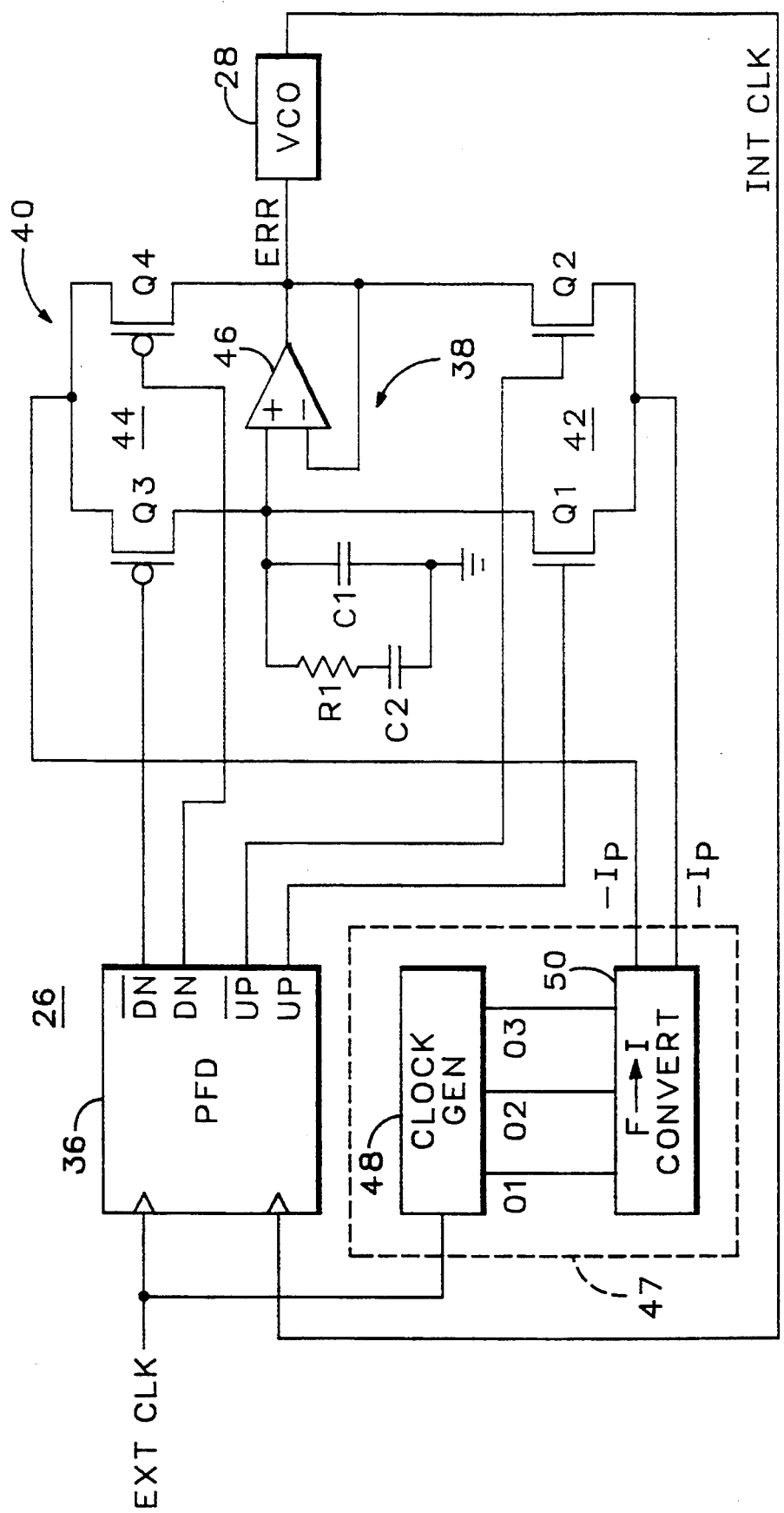
FIG. 4 is a block diagram of a charge-pump phase locked loop circuit suitable for use in the shared delay calibration circuit according to the present invention.

In a conventional PLL, as shown in the Gardner article referred to above, the internal and external clocks are compared using a phase/frequency detector circuit 36, as shown in FIG. 4, which produces "up" and "down" pulses that add or remove charge from the capacitors C1, C2 in the loop filter 38 by steering a phase current Ip into or out of the loop filter. The voltage across the loop capacitor C1 controls the VCO 28 which generates the internal clock. When the difference between the external and internal clock frequencies is significant, the phase/frequency detector circuit 36 produces the appropriate "up" or "down" pulses with a large duty cycle. When the frequencies are the same or close enough that the two clocks may be considered to just differ in phase, then the widths of the "up" or "down" pulses are proportional to the phase difference between the clocks. The magnitude of the steered current Ip and the size of the capacitors C1, C2 in the loop filter 38 determine the rate of change of the frequency output. To compensate for the response lag caused by propagation and digital quantization delay, lead compensation is added via the resistor R1 and capacitor C2 in series. To minimize capture time a large loop gain is needed. However because of propagation delays in the various components and particularly in the VCO 28, too much gain causes the circuit to become unstable. The effect of the propagation delays becomes more pronounced at higher frequencies. To obtain the smallest capture time over a large frequency range requires that the loop gain be inversely proportional to frequency, i.e., proportional to clock period. To rely on the loop filter 38 to provide high frequency attenuation introduces additional propagation delay.

The phase/frequency detector circuit 36 provides an output in the form of complementary UP and DOWN signals, indicating whether the internal clock is leading or lagging the external clock. These UP, DOWN signals are input to a charge pump 40 in the form of an UP switch 42 of a pair of differential input field effect transistors (FETs) (Q1, Q2) and a DOWN switch 44 of a pair of differential input FETs (Q3, Q4) of opposite polarity. The output of one of the pairs (Q1, Q3) of each transistor pair is input to the loop filter 38, and the output of the other of the pairs (Q2, Q4) is coupled to the output of the loop filter. The loop filter 38 has an operational amplifier 46 with a parallel combination of the charge pump capacitor C1 and the series lead compensation resistor R1 and capacitor C2 coupled to one input, as well as to the first outputs from the FETs (Q1, Q3). The output of the operational amplifier 46 is coupled back to the other input and to the other outputs of the FETs (Q2, Q4). The output of the operational amplifier 46 is the error signal ERR.

Figure 5:
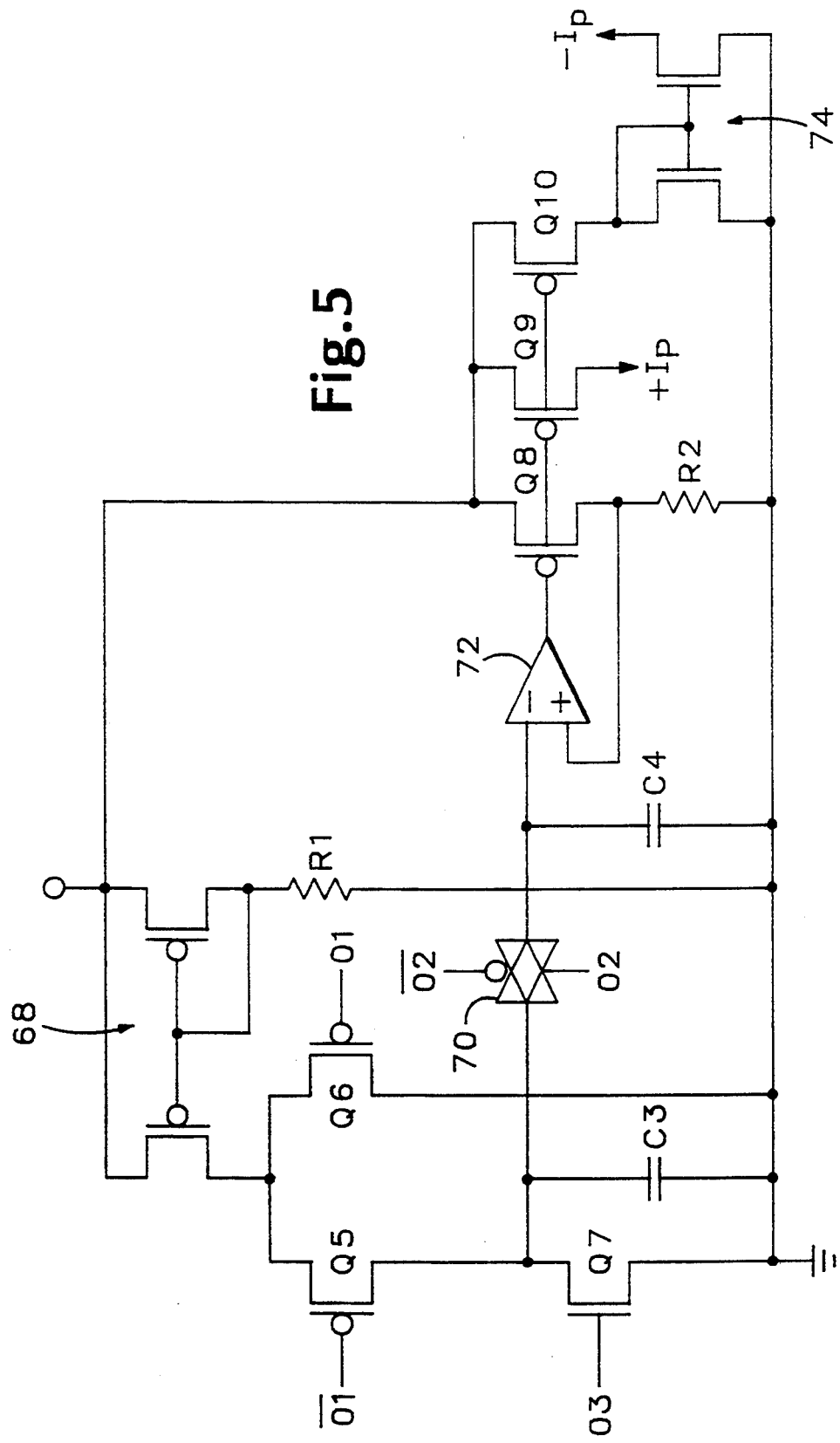
FIG. 5 is a schematic diagram of a frequency to current converter for the charge-pump phase locked circuit according to the present invention.

Rather than a conventional constant current source for the phase current Ip, a differential current source 47 is added to the circuitry. The differential current source 47 derives a differential phase current $+Ip$, $-Ip$ from the external clock. The external clock is input to a clock generator 48 that divides the external clock into three non-overlapping phase signals, as is well known in the art. The three phase signals are input to a frequency to current converter 50 to produce the differential currents $+Ip$, $-Ip$. As shown in FIG. 5 a constant current source 68 provides current for a first differential pair of FETs Q5, Q6 to which is input a differential Phase1 signal from the clock generator 48. The drain of the positive Phase1 signal FET Q6 is coupled to ground, while the drain of the negative Phase1 signal FET Q5 is coupled to an opposite polarity FET Q7 that is gated by the Phase3 signal. A storage capacitor C3 is coupled between the junction of the negative Phase1 and Phase3

FETs Q5, Q7 and ground. A transmission gate 70, controlled by a differential Phase2 signal, couples the storage capacitor C3 to a hold capacitor C4 and to the inverting input of an operational amplifier 72. The output of the operational amplifier 72 is applied to the gates of a buffer FET Q8, a positive output FET Q9 and a negative control FET Q10. The output of the buffer FET Q8 is coupled to the positive input of the operational amplifier 72. The output of the positive output FET Q9 provides the positive charge current $+I_p$, and the output of the negative control FET Q10 drives a current mirror 74 that provides the negative charge current $-I_p$.

During Phase1 current from the constant current source 68 is steered into the storage capacitor C3. Otherwise the current during other phases is shunted to ground by FET Q6. The charge added to the storage capacitor C3, and therefore the voltage increase, is proportional to the Phase1 signal, which in turn is proportional to the external clock period. During Phase2 the transmission gate 70 is turned on, causing the charge on the storage capacitor C3 to be transferred to the hold capacitor C4, which is a much smaller capacitor. During Phase3 the storage capacitor C3 is discharged by FET Q7. Thus over time the voltage across the hold capacitor C4 becomes proportional to the period of the external clock. The operational amplifier 72 and the buffer FET Q8 cause a voltage to be established across a buffer resistor R2 equal to that across the hold capacitor C4. Therefore the current through the buffer resistor R2 becomes proportional to the external clock period. The gate to source voltage of the positive output FET Q9 is the same as that of the buffer FET Q8 and, since both FETs are in saturated mode, the positive output current $+I_p$ is identical to the current through the buffer transistor R2. The negative control FET Q10 and current mirror 74 provide the negative output current $-I_p$ of the same magnitude as $+I_p$. Thus the external clock frequency is sensed and the loop gain is adjusted by adjusting the currents $+I_p$, $-I_p$ to be proportional to the external clock period. These currents directly adjust the loop gain of the PLL by affecting the rate at which the loop filter 38 voltages can change. The operation of the PLL is not adversely affected since no additional delay is introduced. Thus the minimum capture time is achieved over a wide frequency range.

Figure 6:
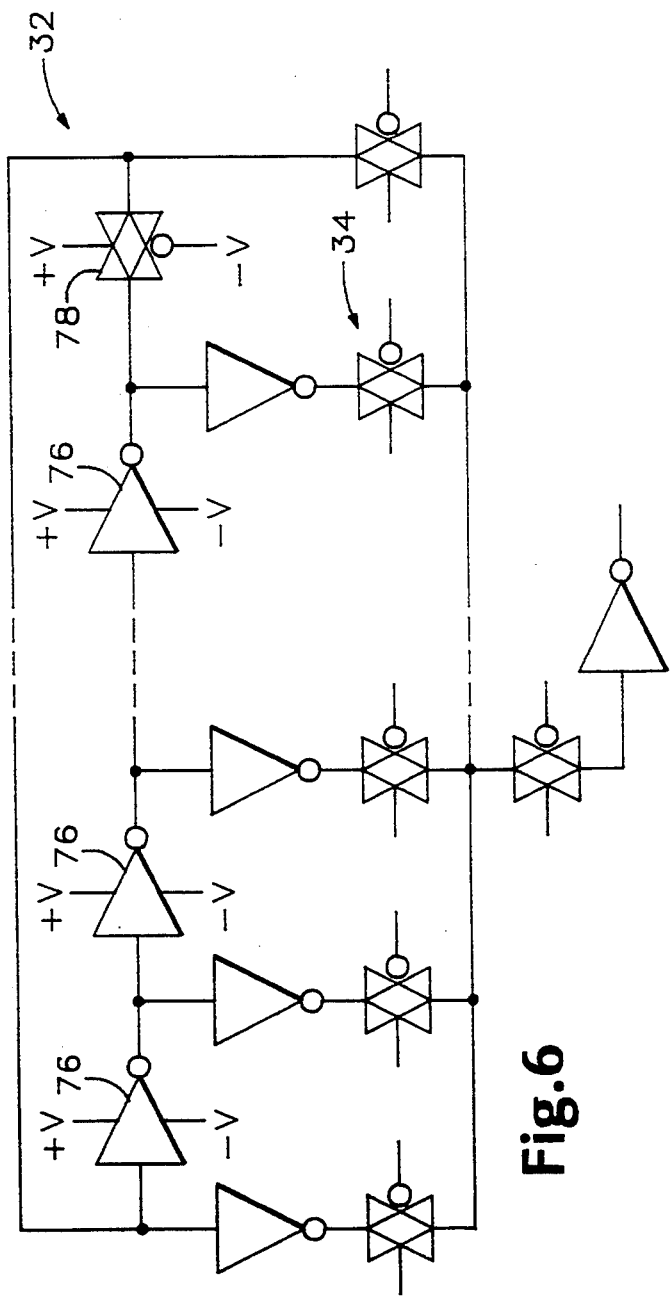
FIG. 6 is a block diagram of a ring oscillator and multiplexer for the shared delay calibration circuit according to the present invention.
Figure 7:
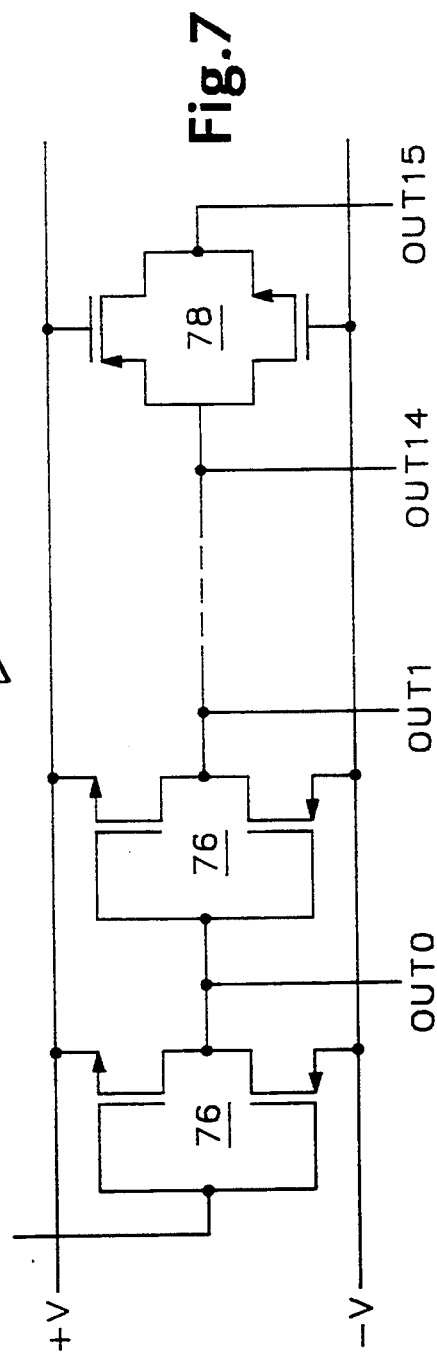
FIG. 7 is a partial schematic diagram of the ring oscillator according to the present invention.

The ring oscillator OSC 32, as shown in FIGS. 6 and 7, has a plurality of delay elements 76 coupled in series, with the output of the last element being coupled to the input of the first element via a transfer switch 78. The outputs of each delay element are input to the multiplexer 34, from which one output is taken as the output of the oscillator 32. A characteristic of the delay elements 76 is that the amount of the delay for each element is a function of the voltage $+V$, $-V$ applied across the element. Thus a pulse that propagates around the ring produces a frequency output that is twice the inverse of the total propagation delay of the delay elements 76. Varying the voltage rails $+V$, $-V$ for the delay elements 76 provides the necessary control of the OSC frequency.

The reference voltage generator 30, shown in FIG. 8, makes use of an inverter circuit, shown in U.S. Pat. No. 4,578,600 issued Mar. 25, 1986 to Terence E. Magee entitled "CMOS Buffer Circuit", as modified by U.S. Pat. No. 4,833,350 issued May 23, 1989 to Arnold M. Frisch entitled "Bipolar-CMOS Digital Interface Circuit", both of which are hereby incorporated by reference. The modified Magee inverter circuit is referred to hereafter as a Magee emulator. The error signal ERR produced from the "up" and "down" pulses from the phase/frequency detector circuit 36 is input to a pair of operational amplifiers 79, 80. One amplifier 80 is configured as a unity gain buffer, the output of which is coupled to one input of a Magee emulator 77 formed by the four FETs Q11-Q14 and output buffers 82, 84. The other amplifier 79 is configured as a feedback amplifier to provide positive gain for ERR. The amplified ERR is applied to the other input of the Magee emulator 77. The outputs from the output buffers 82, 84 provide the $+V$, $-V$ rails for the delay elements 76 of the OSC 38.

The Magee emulator 77 provides a means of making high performance CMOS inverters where the switching voltage is one-half the power supply voltage. However in the present application it is desirable to adjust the supply voltage $+V$, $-V$ of the CMOS inverters while maintaining the same switching voltage. It is also desirable to adjust the supply voltage $+V$, $-V$ to nearly the maximum range of the power supply voltage. Since the delay elements 76 have a propagation delay that is a function of the voltage applied across them, to get maximum frequency range it is desirable that the reference voltage rails $+V$, $-V$ be able to approach the supply voltage rails, Vcc, Vee or GND. The circuit 30 of FIG. 8 has a limitation that the voltage rails $+V$, $-V$ cannot exceed one-half of the supply voltage rails. To avoid this problem the outer two transistors Q11, Q14 of the Magee emulator 77 are converted to voltage sources, as shown in FIG. 9. This is possible since the current flow through all of the transistors Q11-Q14 is the same. Then the control voltage is added in series with the positive Vcc rail and subtracted from the negative, or ground, power rail.

Figure 10:
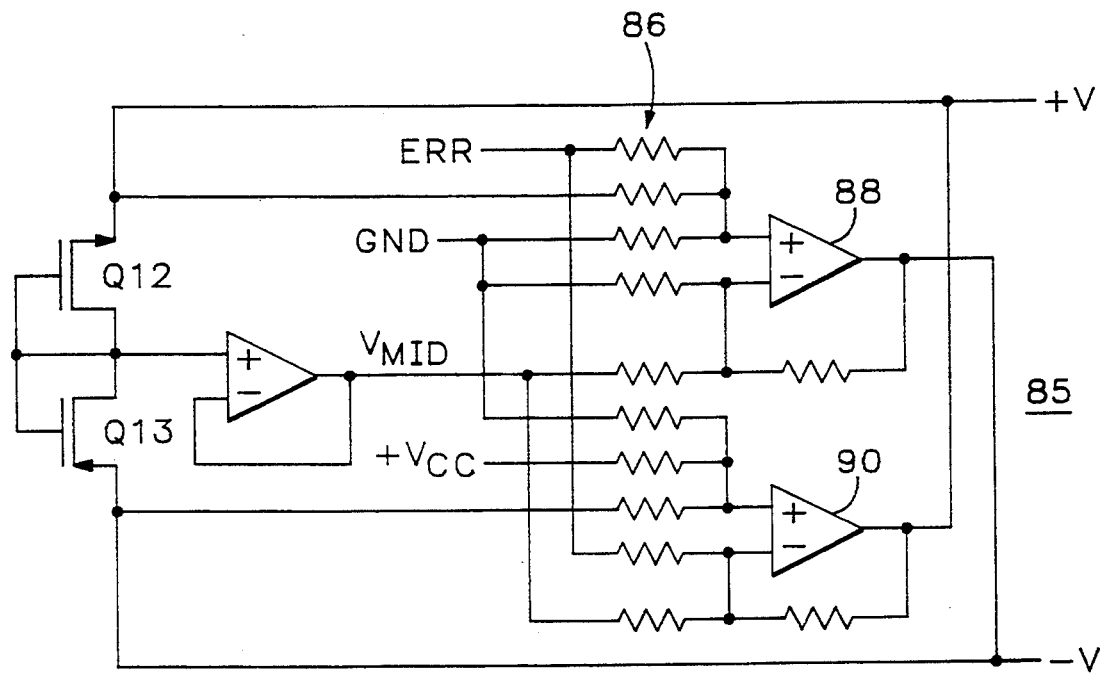
FIG. 10 is a schematic diagram of the alternative variable supply voltage generator according to the present invention.

Therefore a modified reference voltage generator 85 is shown in FIG. 10. The operational amplifiers 88, 90 and resistor network 86 act as respective voltage sources in series with the output terminals $+V$, $-V$ to increase the voltage available to the transistors Q12, Q13. The error signal is added to the Vcc power supply rail and subtracted from the ground power supply rail. The modified circuit 85 replaces the outer two FETs Q11, Q14 of the Magee emulator 77 with the resistor network 86 and operational amplifiers 88, 90. The positive output from the FETs Q12, Q13 is resistor coupled to one input of one 88 of the operational amplifiers. A voltage divider, which is part of the resistor network 86, biases the one input at a point determined by the error signal ERR. The other input of the one operational amplifier 88 is biased by a voltage divider between ground and a midrange voltage Vmid, which is halfway between the supply voltage rails. A feedback resistor between the output of the one operational amplifier 88 and the second input provides appropriate gain. The output of the one operational amplifier 88 is coupled to the negative reference rail $-V$.

Likewise the negative output $-V$ is tied to a first input of the other operational amplifier 90 which is biased by a voltage divider between the supply rails. The second input is determined by a voltage divider between Vmid and ERR. A feedback resistor between the output of the other operational amplifier 90 and the second input provides appropriate gain, and the output is coupled to the positive reference rail $+V$. The values of the resistors for the resistor network 86 may all be equal.

Figure 11:
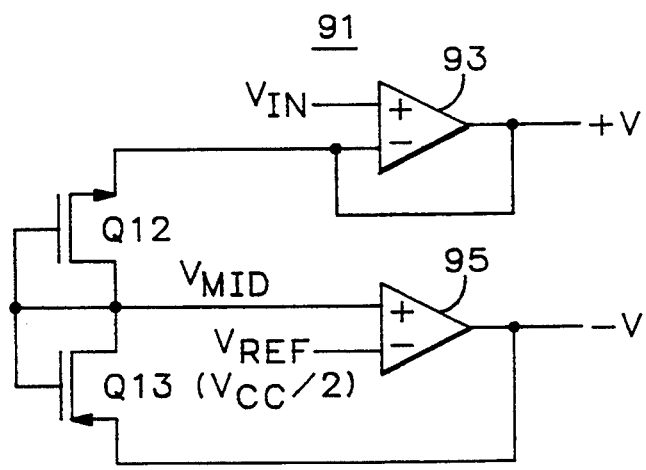
FIG. 11 is a schematic diagram of yet another alternative variable supply voltage generator according to the present invention.

An alternative embodiment 91 is shown in FIG. 11. An input control signal Vin, which is the combination of the positive power supply rail and the error signal, is input to a first operational amplifier 93 so that it directly controls the positive voltage rail +V. The other input to the first operational amplifier 93 is the positive output from the p-channel transistor Q12. The output rail is coupled to the positive output of the p-channel transistor Q12. Likewise the midrange voltage Vmid from the transistors Q12, Q13 is applied to one input of a second operational amplifier 95, with one-half the power supply voltage Vcc/2 applied as a reference to the other input. The output of the second operational amplifier 95 is coupled to the output of the n-channel transistor Q13 and to the negative voltage rail −V. The first operational amplifier 93 buffers the input control signal, and the second operational amplifier 95 has a high impedance to assure that the current through the two transistors Q12, Q13 is identical. The output of the second operational amplifier 95 sinks the current through the two transistors Q12, Q13 so that the voltage at the transistor junction is held at the reference voltage. Thus the input control signal directly adjusts the positive rail voltage +V while the negative rail voltage −V tracks the changes so that the correct −V is generated for the desired +V.

Figure 12:
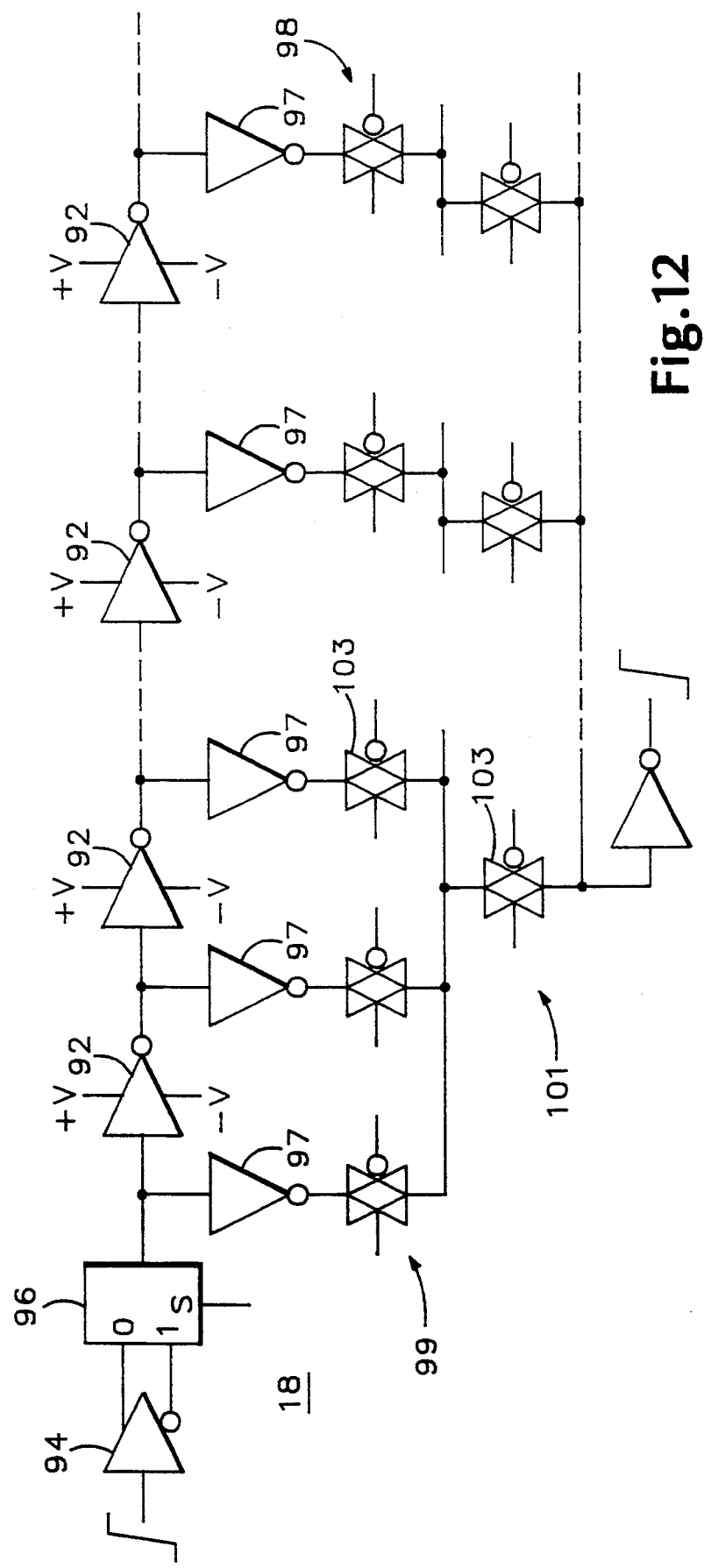
FIG. 12 is a block diagram of an interpolator for the timing analyzer circuit according to the present invention.

The interpolator 18, as shown in FIG. 12, also has voltage controlled delay elements 92 like the ring oscillator 38. In a timing measurement system based upon selecting a predetermined number of inverters to establish a time delay, the delay increments generally are not equal for positive and negative going outputs from the selected inverter. This occurs because the fanout sensitivity, gain and input capacitance of the inverters are all sensitive to the polarity of the output drive. Since the inverter whose output is selected is the most heavily loaded of the inverters in the chain, these problems are accentuated, resulting in very different delay increments for positive and negative polarities. Therefore to equalize the delay increments, the polarity of the input signal to the inverter chain is controlled so that the selected output always has the same polarity signal. The input to the interpolator 18 is a single-ended input that is applied to a single to differential converter 94 to provide a complementary data signal D, /D. The complementary data signal is input to a simple multiplexer 96 to provide either D or /D as the input to the interpolator delay elements 92, i.e., to control the polarity of the input that is applied to the delay elements. The simple multiplexer 96 may be implemented with either an exclusive OR gate or an exclusive NOR gate, as shown in greater detail in FIGS. 13 and 14, respectively. Outputs are taken from the output of the multiplexer 96 and each delay element 92, and are input to an output multiplexer 98, which may be in a tree configuration as shown. The output multiplexer 98 has an inverter 97 to reduce the capacitive load on the delay inverters 92, followed by two stages 99, 101 of transmission gates 103. The two stage design minimizes propagation delay. The first stage 99 requires fully decoded inputs (INT) from the command register 19 so that only one delay inverter 92 is loaded, while the second stage 101 is a traditional four input multiplexer. Depending upon the particular tap of the interpolator 18 that is selected for output by the output multiplexer 98, the input multiplexer 96 provides the appropriate data signal D, /D so that the output signal always has the same polarity.

Figure 13:
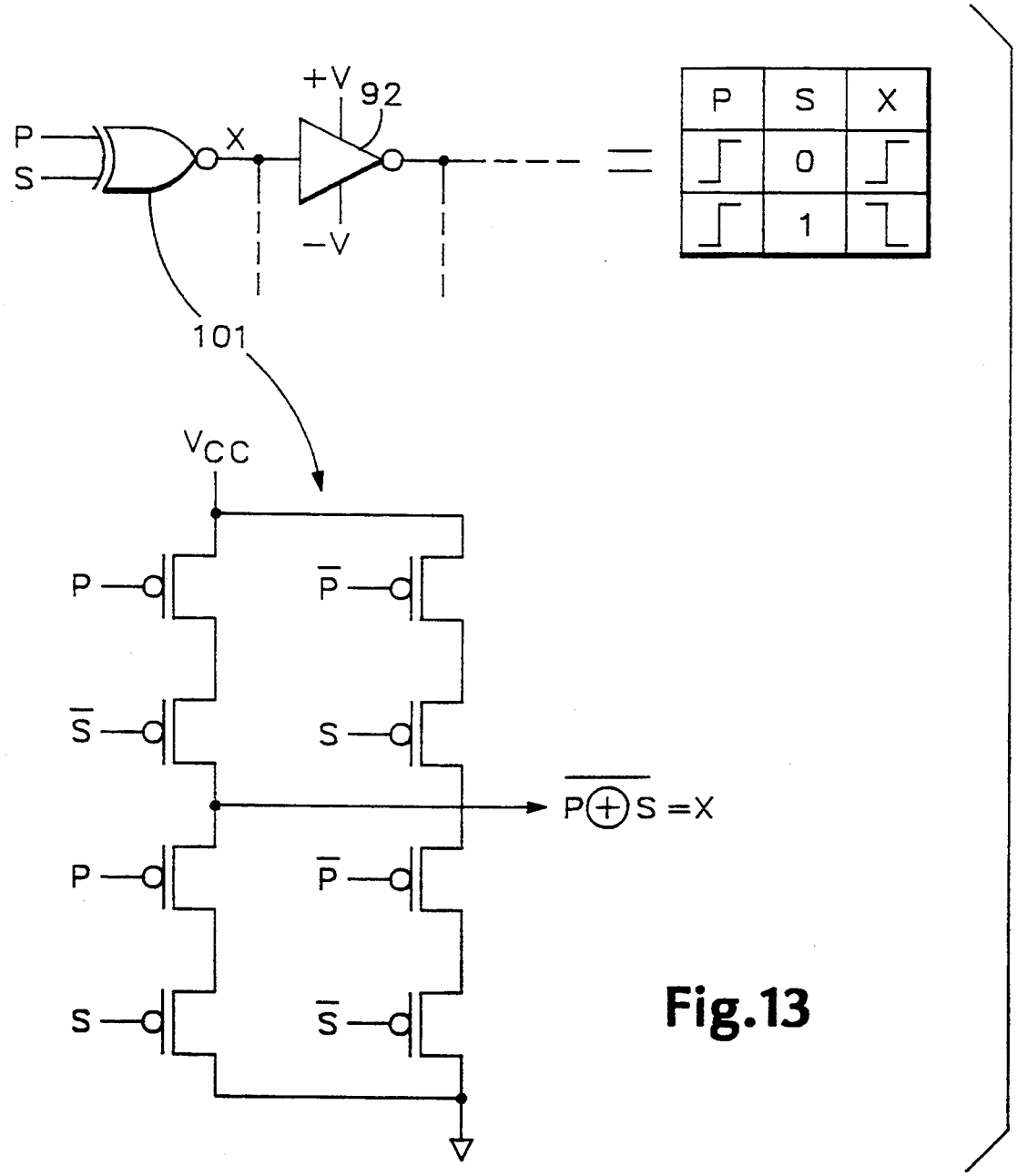
FIG. 13 schematic diagram of an exclusive OR gate for the interpolator according to the present invention.
Figure 14:
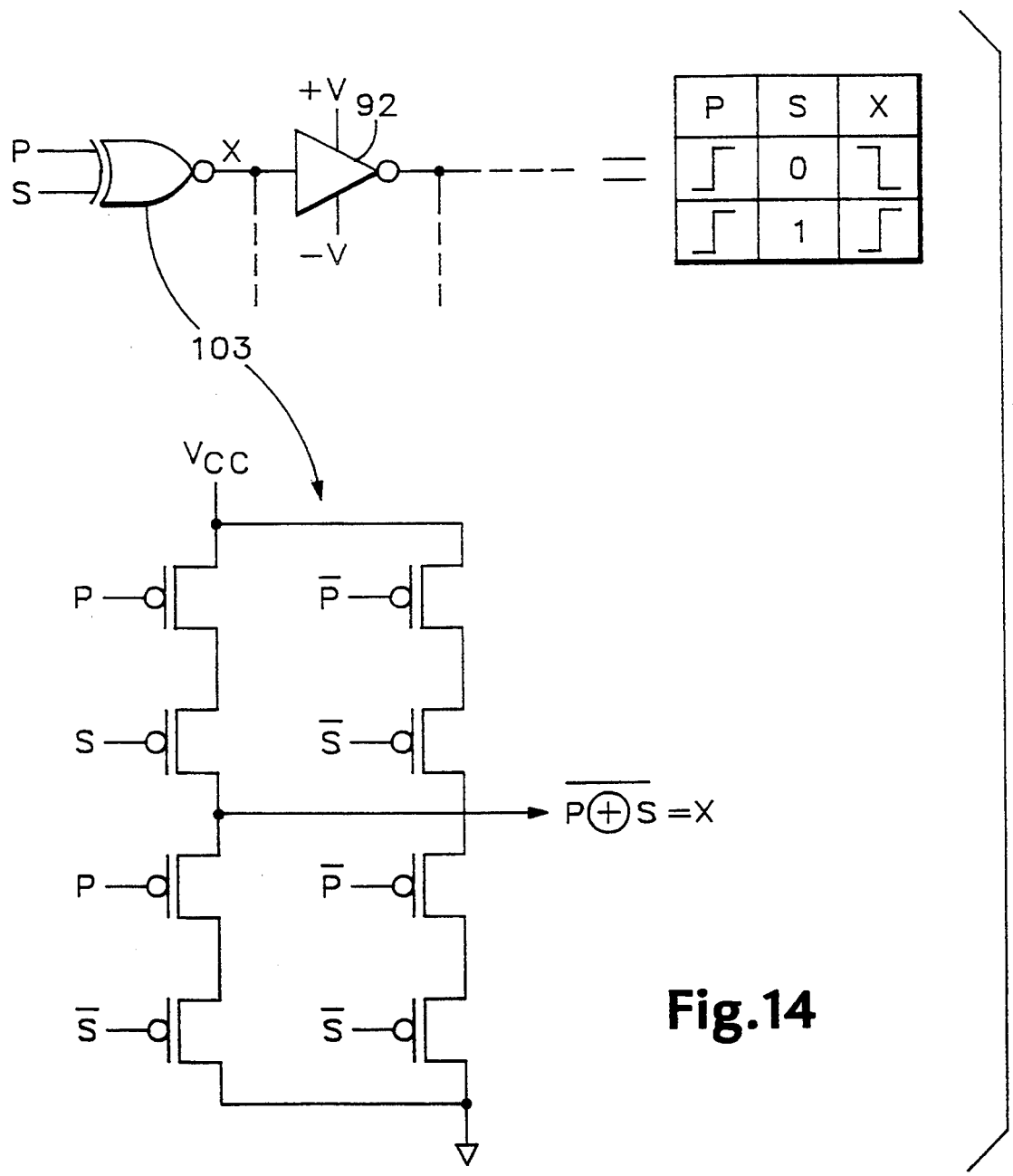
FIG. 14 is a schematic diagram of an exclusive NOR gate for the interpolator according to the present invention.

The exclusive OR gate configuration 101, as shown in FIG. 13, has as inputs the pulse P from the down counter 16 or state machine and an enable signal S from the decoded interpolation value. If the enable signal is zero, then when the pulse goes positive the output X goes positive. But if the enable signal is one, then when the pulse goes positive the output goes negative. Likewise for the exclusive NOR gate configuration 103; as shown in FIG. 14, the pulse P and enable signal S are input to the gate. If the enable signal is zero, then when the pulse goes positive the output X goes negative; but if the enable signal is one, then when the pulse goes positive the output goes positive.

Another solution for reducing the inequality of delay increments of the interpolator 18 is to use heavy buffering at the outputs of the inverter chain, possibly including polarity reversal at alternate taps. However this solution involves much more hardware and power dissipation, and does not work as well.

Figure 15:
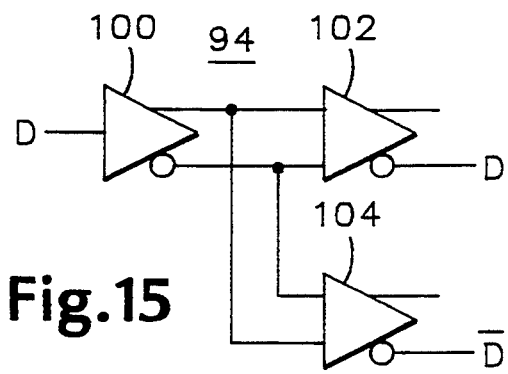
FIG. 15 is a block diagram of a single-ended to complementary signal converter for the interpolator according to the present invention.
Figure 16:
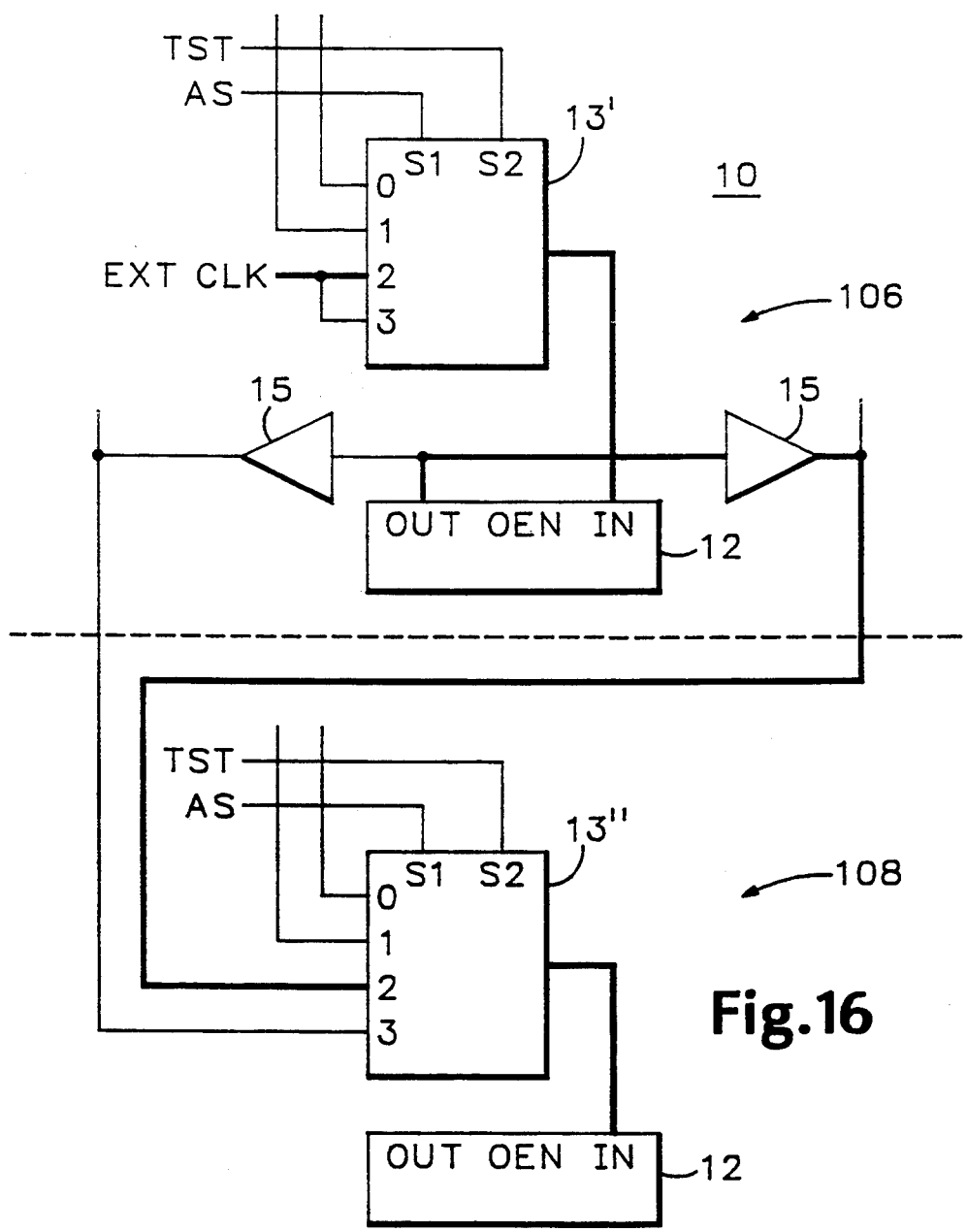
FIG. 16 is a partial block diagram of a calibration setup for the timing analyzer according to the present invention.

Complementary signals usually are developed from a single ended input by inversion, using logic inverters. However this misaligns the signals in time by one inverter propagation delay. Paralleling a non-inverting buffer with two cascaded inverters to achieve a buffer delay equal to the delay of a single inverter provides good complementary signals only when there is no capacitive load. The single ended to differential converter 94 shown in FIG. 15 is a combination of three differential amplifiers 100, 102, 104. The first differential amplifier 100 converts the data signal into an imperfect set of differential output signals. These outputs are applied in a cross-coupled manner to the inputs of the two similar output differential amplifiers 102, 104. The inverted outputs from the two output differential amplifiers 102, 104 are taken to provide the D, /D complementary data signal for input to the input multiplexer 96. The complementary data signals are well time aligned since the difference voltages between their sets of input terminals are exactly equal in magnitude and inverted in sign.

In operation the timing analyzer 12 is calibrated from the external clock via the shared delay calibration circuit 24. The reference voltage rails +V, −V, generated in the shared delay calibration circuit 24, are applied to the delay elements 92 in the interpolators 18 so that each output provides a delay in increments of 1/N times the external clock period, where N is the number of delay elements in the interpolator. The event command is read from the instruction memory 14, with the clock value being loaded into the down counter 16 and the interpolation value being decoded in the command register 19 and applied as the multiplexer control Signal to the interpolator output multiplexer 98. The external clock decrements the down counter 16 to a terminal value and the interpolation output is added at the end of the terminal value to provide the desired timing or trigger signal. The timing signal is used optionally to drive one of the output pins of the integrated circuit 10 and is used to capture a data value at one of the input pins. The captured values are retrieved at the board or module interface via the program bus, which may be a boundary scan interface.

Calibration of the timing analyzer IC 10 is a two step process that may be combined into a single step. However it is described below as two steps for ease of understanding. The timing analyzer IC 10 needs to be calibrated for interchannel skew. This is done via the two modified circuits 106, 108 using two of the transceiver channels, as shown in FIG. 17. To calibrate acquisition a test sequence is loaded into the first modified circuit 106 that has an acquisition at each interpolator output value. A test bit (TST) in the boundary scan test data register is set, and the tests are run. The modified circuit acquires the external clock rather than data from the DUT. The interpolator value at which the captured clock positive transition occurs is a skew value that is subtracted from all acquisition times. The test vectors to be loaded into the instruction registers 14 are adjusted to compensate for the skew value.

To capture the timing analyzer IC 10 drive skew, the output pin for the first modified circuit 106 is driven. The second modified circuit 108 is programmed to acquire at the start of the external clock cycle, using the skew results obtained from the acquisition calibration. The first modified circuit 106 is programmed to drive with positive transitions at each interpolator value interval. Again the test bit is set in the test data register and the test is run. The acquired values are examined and the first captured negative transition marks a driving interpolator delay value for compensation. That value is subtracted from all the driving times in the test vectors loaded into the instruction memories 14.

The two tests are combined by acquiring in the second modified circuit 108 at interpolator delay value zero, while driving on the first modified circuit 106 with positive transitions at each interpolator value. The test signal travels along the path indicated by the bold lines in FIG. 17. The data stored in the capture register 22 is scanned out and analyzed. Since the first modified circuit 106 acquired the external clock levels during the test, the minimum interpolator delay showing a logic one captured value represents the acquisition time delay. The minimum interpolator delay showing a logic one in the second modified circuit 108 is the driving delay plus the acquisition delay. These skew values are subtracted from the delays in the subsequent test vectors sent to the timing analyzer IC 10.

Thus the present invention provides a timing analyzer for embedded testing of a printed circuit board, integrated circuit or multi-chip module within which the timing analyzer may be embedded. The timing analyzer is an event-driven tester chip that provides accurate timing based on an external clock from the printed circuit board, integrated circuit or multi-chip module which drives a charge-pumped phase-locked loop having a voltage control signal in the form of variable voltage rails. The variable voltage rails provide power for the delay elements of the PLL oscillator as well as for the vernier timing elements of an interpolator so that the interpolator provides precise time increments over a wide range of external clock frequencies.

What is claimed is:

1. A timing analyzer for embedded testing of an electronic device comprising:
   means for coupling the timing analyzer to a data bus and to the device to receive and to provide data to each of a plurality of data channels of the device; and
   a separate analyzer circuit for each data channel so that, when enabled, the analyzer circuits provide an optional test data signal to each data channel and receive a data signal from each data channel according to time event vectors stored in each analyzer circuit, the received data signal being available for reading out from the analyzer circuit over the data bus, each analyzer circuit having:
   an instruction memory in which the time event vectors for the data channel associated with the analyzer circuit are stored, each time event vector having a clock value, an interpolation value and a driver output value;
   means coupled to receive the clock value from the time event vectors from the instruction memory for providing a pulse output for each time event vector in sequence at the beginning of a clock interval, as determined by the clock value, of a reference clock signal from the device;
   a command register coupled to receive the interpolation value and driver output value from the time event vectors and to provide a decoded interpolation command from the interpolation value and the test data signal and an output enable command from the driver output value for each time event vector in sequence;
   a delay interpolator coupled to receive the pulse from the counter and to produce a trigger signal delayed by a precise incremental portion of a cycle of the reference clock signal as determined by the decoded interpolation command;
   a capture register clocked by the trigger signal for receiving the data signal from the data channel;
   drive logic for receiving the test data signal and output enable command from the command register and the trigger signal from the delay interpolator and for driving the data channel with the test data signal at the time of the trigger signal when enabled by the output enable command; and
   a shared delay calibration circuit for generating a precision delay control signal for the delay interpolators of the analyzer circuits as a function of the reference clock signal so that each incremental portion is precisely determined over a wide range of frequencies of the reference clock signal.

2. The timing analyzer as recited in claim 1 wherein the providing means comprises a down counter coupled to receive the clock value to provide the pulse output when the count loaded into the down counter by the clock value is counted down to zero by the reference clock signal.

3. The timing analyzer as recited in claim 1 wherein the providing means comprises a state machine coupled to receive the clock value to provide the pulse output at the beginning of the clock interval of the reference clock signal determined by the clock value.

4. The timing analyzer as recited in claim 1 wherein the shared delay calibration circuit comprises:
   a ring oscillator having a plurality of delay elements coupled in a ring to produce an internal clock signal, the amount of delay for each delay element being identical and being determined by a voltage control signal; and
   a phase-locked loop including means coupled to receive the internal clock signal and the reference clock signal for generating an error signal indicative of a phase/frequency difference between the two clocks signals, and means for generating the voltage control signal for the delay elements from the error signal.

5. The timing analyzer as recited in claim 4 wherein the delay interpolator comprises:
   a plurality of delay elements coupled in cascade, the delay for each delay element being identical to each other and to the delay elements of the ring oscillator and being determined by the voltage control signal;

means for selecting the trigger signal from among the outputs from the delay elements and the input to the first delay element as a function of the decoded interpolation command; and means for controlling a polarity of the pulse for input to the first delay element so that the trigger signal has a predetermined polarity.

6. The timing analyzer as recited in claim 5 wherein the controlling means comprises:

a single ended to complementary signal converter for converting the pulse to time aligned complementary data signals; and a selector for selecting one of the time aligned complementary data signals for input to the first delay element so that the trigger signal has the predetermined polarity.

7. The timing analyzer as recited in claim 6 wherein the selector comprises a logic gate having the time aligned complementary data signals and a select signal as inputs and providing the trigger signal with the predetermined polarity.

8. The timing analyzer as recited in claim 7 wherein the logic gate comprises an exclusive OR gate having the time aligned complementary data signals and the select signal as inputs.

9. The timing analyzer as recited in claim 7 wherein the logic gate comprises an exclusive NOR gate having the time aligned complementary data signals the select signal as inputs.

10. The timing analyzer as recited in claim 6 wherein the selector comprises:

a source of complementary logical select signals having a true select signal and a complement select signal; and a logic circuit for selecting between the time aligned complementary data signals, the time aligned complementary data signals being a true input signal and a complement input signal, in response to the complementary logical select signals to cause the selected one of the input signals to change a state at a logical output of the logic gate.

11. The timing analyzer as recited in claim 10 wherein the logic circuit comprises:

a first P-channel transistor having a gate coupled to the true input signal and a source coupled to a positive power supply rail;

a second P-channel transistor having a source coupled to a drain of the first P-channel transistor, a gate coupled to the complement select signal and a drain coupled to the logical output;

a third P-channel transistor having a gate coupled to the complement input signal and a source coupled to the positive power supply rail;

a fourth P-channel transistor having a source coupled to a drain of the third P-channel transistor, a gate coupled to the true select signal and a drain coupled to the logical output;

a first N-channel transistor having a gate coupled to the true input signal and a drain coupled to the logical output;

a second N-channel transistor having a drain coupled to a source of the first N-channel transistor, a gate coupled to the true select signal and a source coupled to a negative power supply rail;

a third N-channel transistor having a gate coupled to the complement input signal and a drain coupled to the logical output; and a fourth N-channel transistor having a drain coupled to a source of the third N-channel transistor, a gate coupled to the complement select signal and a source coupled to the negative power supply rail;

whereby a logical exclusive OR function is performed by the logic gate.

12. The logic gate as recited in claim 10 wherein the logic circuit comprises:

a first P-channel transistor having a gate coupled to the true input signal and a source coupled to a positive power supply;

a second P-channel transistor having a source coupled to a drain of the first P-channel transistor, a gate coupled to the true select signal and a drain coupled to the logical output;

a third P-channel transistor having a gate coupled to the complement input signal and a source coupled to the positive power supply rail;

a fourth P-channel transistor having a source coupled to a drain of the third P-channel transistor, a gate coupled to the complement select signal and a drain coupled to the logical output;

a first N-channel transistor having a gate coupled to the true input signal and a drain coupled to the logical output;

a second N-channel transistor having a drain coupled to a source of the first N-channel transistor, a gate coupled to the complement select signal and a source coupled to a negative power supply rail;

a third N-channel transistor having a gate coupled to the complement input signal and a drain coupled to the logical output; and a fourth N-channel transistor having a drain coupled to a source of the third N-channel transistor, having a gate coupled to the true select signal and a source coupled to the negative power supply rail;

whereby a logical exclusive NOR function is performed by the logic gate.

13. The timing analyzer as recited in claim 5 wherein the single ended to complementary signal converter comprises:

an input amplifier having the pulse as an input and providing intermediate complementary data signals as outputs; and a pair of output differential amplifiers having the intermediate complementary data signals cross-coupled to the inputs and having the time aligned complementary data signals taken from the respective same-type outputs of the output differential amplifiers.

14. The timing analyzer as recited in claim 4 wherein the phase-locked loop error signal generating means comprises:

means for developing a current control signal from the internal and reference clock signals;

a loop filter coupled to receive the current control signal and a phase current signal for generating the error signal, the current control signal steering the phase current signal into or out of the loop filter; and means for controlling the gain of the loop filter as a function of the frequency of the reference clock signal.

15. The timing analyzer as recited in claim 14 wherein the gain controlling means comprises:

means for generating phase control signals from the reference clock signal;

means in response to the phase control signals for generating the phase current signal as a function of the period of the reference clock signal.

16. The timing analyzer as recited in claim 15 wherein the phase current signal generating means comprises:

means for charging a storage capacitor with a charge current for a duration of a first one of the phase signals, the duration of the first one of the phase signals being proportional to the period of the reference clock signal;

means for transferring the charge from the storage capacitor to a hold capacitor during a second one of the phase signals; and means for converting the charge on the hold capacitor to the phase current signal.

17. The timing analyzer as recited in claim 16 wherein the phase current signal generating means further comprises means for discharging the storage capacitor during a third one of the phase signals.

18. The timing analyzer as recited in claim 4 wherein the phase-locked loop voltage control signal generating means comprises:

a Magee emulator having a first input and a second input and providing the voltage control signal as a differential voltage; and means for amplifying the error signal and coupling the amplified error signal across the inputs of the Magee emulator.

19. The timing analyzer as recited in claim 4 wherein the phase-locked loop voltage control signal generating means comprises:

a pair of opposite polarity transistors coupled together to have a common input and a common output tied together to form an inverter, and to have a differential output so that a common current flows through both transistors, the differential output providing the voltage control signal as a differential voltage;

means coupled between the respective voltage rails of a power supply and the differential output for mirroring the voltage across each of the transistors; and means for adding the error signal to one of the power supply voltage rails and subtracting it from the other of the power supply voltage rails.

20. The timing analyzer as recited in claim 19 wherein the mirroring and adding/subtracting means comprise a pair of operational amplifiers, each having a plurality of inputs and an output, the outputs of the operational amplifiers being coupled to the differential output, the plurality of inputs being coupled to the power supply voltage rails, the common outputs and the error signal so that the differential voltage has a maximum range between the power supply voltage rails.

21. The timing analyzer as recited in claim 19 wherein the mirroring and adding/subtracting means comprise:

a buffer amplifier having the error signal as one input and an output; and a comparator amplifier for comparing the common outputs with a reference voltage, the comparator amplifier having an output, the outputs of the buffer and comparator amplifiers providing the differential voltage.

* * * * *